(12) United States Patent
Kawaguchi et al.

(10) Patent No.: US 11,569,135 B2
(45) Date of Patent: Jan. 31, 2023

(54) PLASMA PROCESSING METHOD AND WAVELENGTH SELECTION METHOD USED IN PLASMA PROCESSING

(71) Applicant: Hitachi High-Tech Corporation, Tokyo (JP)

(72) Inventors: Yohei Kawaguchi, Tokyo (JP); Tatehito Usui, Tokyo (JP); Shigeru Nakamoto, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 15 days.

(21) Appl. No.: 16/981,612

(22) PCT Filed: Dec. 23, 2019

(86) PCT No.: PCT/JP2019/050253
§ 371 (c)(1),
(2) Date: Sep. 16, 2020

(87) PCT Pub. No.: WO2021/130798
PCT Pub. Date: Jul. 1, 2021

(65) Prior Publication Data
US 2021/0249317 A1    Aug. 12, 2021

(51) Int. Cl.
*H01L 21/66* (2006.01)
*H01L 21/311* (2006.01)
(52) U.S. Cl.
CPC ........ *H01L 22/26* (2013.01); *H01L 21/31116* (2013.01); *H01L 21/31144* (2013.01)
(58) Field of Classification Search
None
See application file for complete search history.

(56) References Cited

U.S. PATENT DOCUMENTS

| | | |
|---|---|---|
| 4,238,312 A | 12/1980 | Galicki et al. |
| 5,511,009 A | 4/1996 | Pastor |

(Continued)

FOREIGN PATENT DOCUMENTS

| | | |
|---|---|---|
| JP | S61053728 A | 3/1986 |
| JP | S63200533 A | 8/1988 |

(Continued)

OTHER PUBLICATIONS

E.H. van Veen et al; The Kalman Filtering Approach to Inductively Coupled Plasma Atomic Emission Spectrometry; Spectrochimica Acta Part B: Atomic Spectroscopy vol. 49, Issue 8, 1994, pp. 829-846 (Year: 1994).

(Continued)

*Primary Examiner* — Stephanie P Duclair
(74) *Attorney, Agent, or Firm* — Miles & Stockbridge, P.C.

(57) ABSTRACT

To provide a wavelength selection method or a plasma processing method to achieve accurate detection of residual thickness or etching amount, there is provided a plasma processing method, in which a processing object wafer is disposed within a processing chamber in the inside of a vacuum container, and plasma is generated by supplying a processing gas into the processing chamber and used to process a processing-object film layer beforehand formed on a surface of the wafer, and at least two wavelengths are selected from among wavelengths with large mutual information in emission of a plurality of wavelengths of plasma generated during processing of the processing-object film layer, and a temporal change in the emission of at least the two wavelengths is detected, and an endpoint of the processing of the film layer is determined based on a result of the detection.

16 Claims, 4 Drawing Sheets

(56) References Cited

U.S. PATENT DOCUMENTS

| | | | |
|---|---|---|---|
| 5,565,114 A | 10/1996 | Saito et al. | |
| 5,664,066 A | 9/1997 | Sun et al. | |
| 5,711,843 A | 1/1998 | Jahns | |
| 5,841,651 A | 11/1998 | Fu | |
| 6,285,971 B1 | 9/2001 | Shah et al. | |
| 6,447,369 B1 | 9/2002 | Moore | |
| 6,490,497 B1 | 12/2002 | Mitsuhashi et al. | |
| 6,596,551 B1 | 7/2003 | Usui et al. | |
| 6,609,947 B1 | 8/2003 | Moore | |
| 8,284,401 B2 | 10/2012 | Choi et al. | |
| 9,934,946 B2 | 4/2018 | Kawaguchi et al. | |
| 2004/0020624 A1 | 2/2004 | Duncan et al. | |
| 2004/0267399 A1 | 12/2004 | Funk | |
| 2005/0134835 A1 | 6/2005 | Kim et al. | |
| 2006/0037938 A1 | 2/2006 | Yue | |
| 2006/0195218 A1 | 8/2006 | Yamashita et al. | |
| 2007/0092407 A1 | 4/2007 | Xiao et al. | |
| 2007/0229806 A1 | 10/2007 | Lally et al. | |
| 2007/0229807 A1 | 10/2007 | Lally et al. | |
| 2007/0232045 A1 | 10/2007 | Lally et al. | |
| 2007/0233404 A1 | 10/2007 | Lally et al. | |
| 2007/0237383 A1 | 10/2007 | Funk et al. | |
| 2007/0238201 A1 | 10/2007 | Funk et al. | |
| 2009/0089024 A1 | 4/2009 | Huang et al. | |
| 2009/0242513 A1 | 10/2009 | Funk et al. | |
| 2010/0036514 A1 | 2/2010 | Funk et al. | |
| 2010/0036518 A1 | 2/2010 | Funk et al. | |
| 2011/0054863 A1 | 3/2011 | Larimore | |
| 2011/0315661 A1 | 12/2011 | Morisawa et al. | |
| 2012/0091097 A1 | 4/2012 | Chen et al. | |
| 2012/0252141 A1 | 10/2012 | Sundararajan et al. | |
| 2012/0253497 A1 | 10/2012 | Prager et al. | |
| 2013/0246006 A1 | 9/2013 | Al-Mazrooei et al. | |
| 2014/0022540 A1 | 1/2014 | Asakura et al. | |
| 2014/0156322 A1 | 6/2014 | Monforte et al. | |
| 2014/0262029 A1 | 9/2014 | Asakura et al. | |
| 2014/0323897 A1 | 10/2014 | Brown et al. | |
| 2014/0367260 A1 | 12/2014 | Dickerson et al. | |
| 2015/0021294 A1* | 1/2015 | Togami | H01J 37/32963 216/60 |
| 2016/0173525 A1 | 6/2016 | Thomas et al. | |
| 2016/0211186 A1* | 7/2016 | Nakamoto | H01J 37/32972 |
| 2016/0336154 A1 | 11/2016 | Watanabe et al. | |
| 2016/0351405 A1* | 12/2016 | Fukuchi | H01L 22/26 |
| 2017/0178874 A1 | 6/2017 | Kawaguchi et al. | |
| 2018/0275621 A1 | 9/2018 | Kniazev et al. | |

FOREIGN PATENT DOCUMENTS

| | | |
|---|---|---|
| JP | S63254732 A | 10/1988 |
| JP | H04057092 B2 | 9/1992 |
| JP | H0766173 A | 3/1995 |
| JP | 2000228397 A | 8/2000 |
| JP | 2001319924 A | 11/2001 |
| JP | 2010219263 A | 9/2010 |
| JP | 2010251813 A | 11/2010 |
| JP | 2011009546 A | 1/2011 |
| JP | 2014022621 A | 2/2014 |
| JP | 2014179474 A | 9/2014 |
| JP | 2015023104 A | 2/2015 |
| KR | 20110084302 A | 7/2011 |
| WO | 2004102642 A2 | 11/2004 |
| WO | 2010106712 A1 | 9/2010 |

OTHER PUBLICATIONS

E.H. van Veen et al; Kalman Filtering of Data from Overlapping Lines in Inductively Coupled Plasma-Atomic Emission Spectrometry; Spectrochimica Acta vol. 45B No. 8, 1990, pp. 313-328 (Year: 1990).

Search Report dated Apr. 7, 2020 in corresponding International Application No. PCT/JP2019/050253.

Written Opinion dated Apr. 7, 2020 in corresponding International Application No. PCT/JP2019/050253.

* cited by examiner

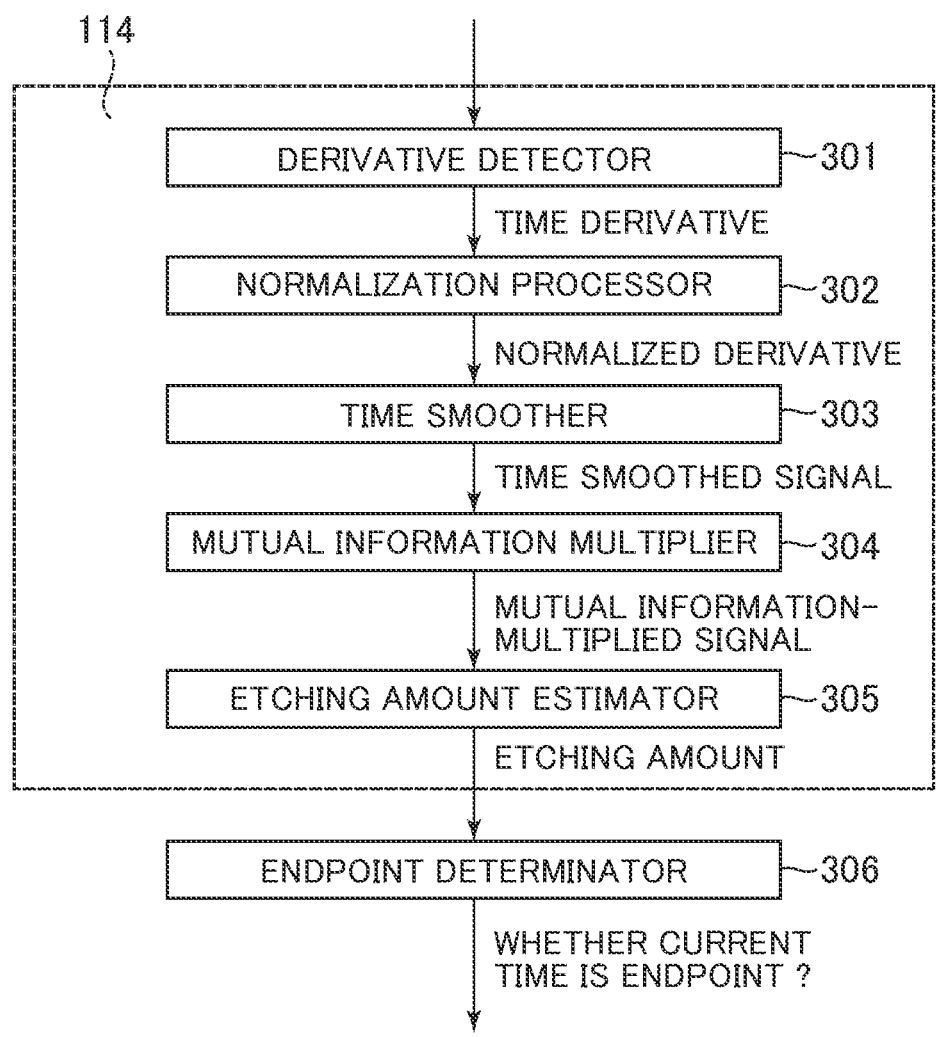

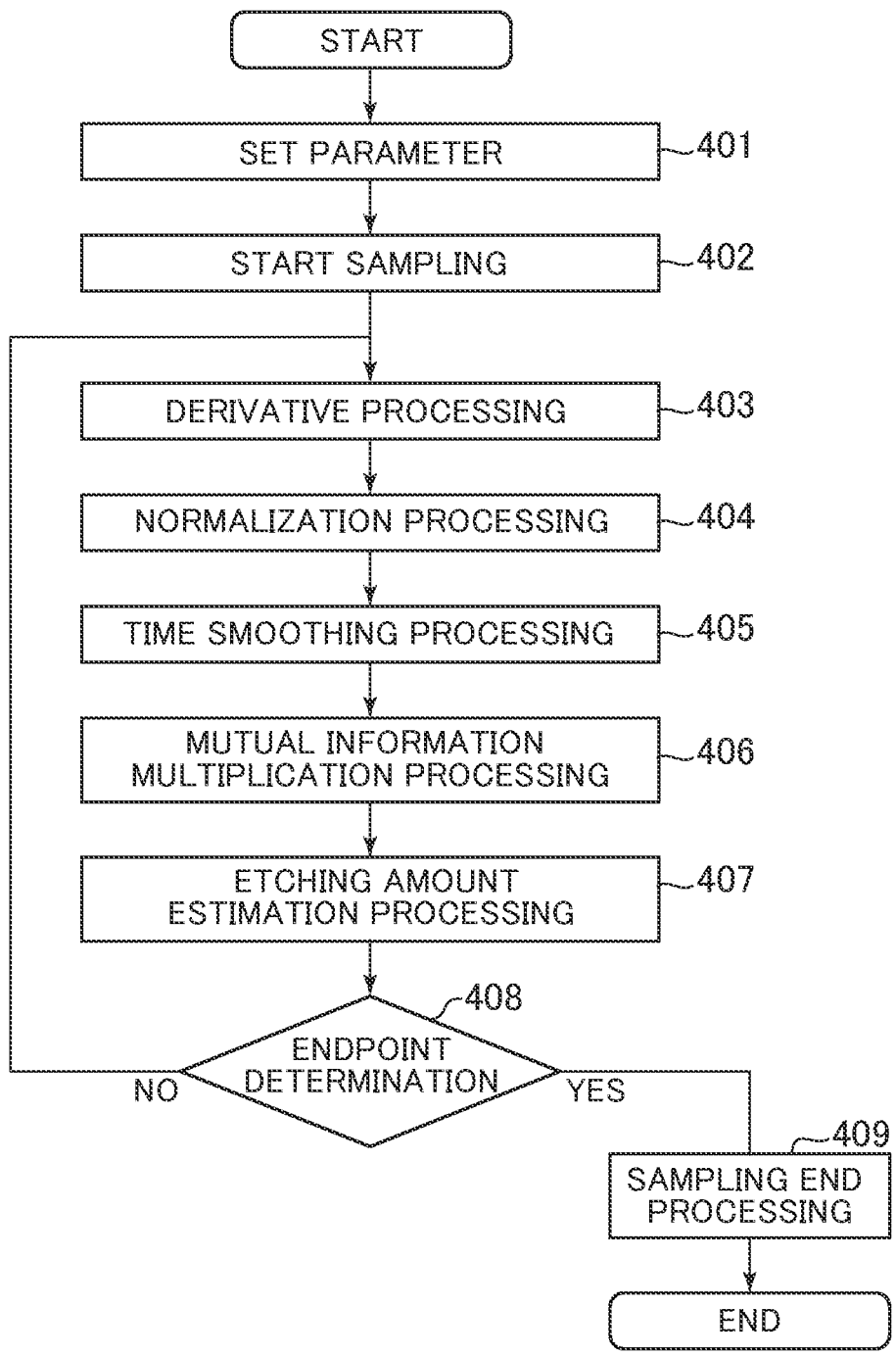

PLASMA PROCESSING METHOD AND WAVELENGTH SELECTION METHOD USED IN PLASMA PROCESSING

TECHNICAL FIELD

The present invention relates to a wavelength selection method or a plasma processing method, which is used with a plasma processing apparatus in which a process for manufacturing a semiconductor integrated circuit is used so that a substrate-like sample such as a semiconductor wafer disposed within a processing chamber in the inside of a vacuum container is processed using plasma generated in the processing chamber, to detect thickness of a surface of the sample or processing amount using emission from the inside of the processing chamber and detected during the processing.

BACKGROUND ART

In the process for manufacturing a semiconductor device, the following processing, so-called dry etching processing, is performed. That is, the substrate-like sample such as the semiconductor wafer is disposed in the processing chamber within the vacuum container, plasma generated in the processing chamber is used to etch a film structure having a plurality of film layers including a dielectric material and a mask layer formed on the sample surface to form a circuit pattern of the semiconductor device. In such etching processing, it is required to accurately determine an endpoint of etching and appropriately control the processing condition to stop the processing at a desired film thickness or etching depth to form the circuit pattern at high accuracy in order to achieve integrity of the semiconductor device in an increased tendency.

In general, in such etching processing, while the semiconductor wafer is disposed in the processing chamber within the vacuum container, an electric or magnetic field is supplied to a processing gas supplied into the processing chamber and thus atoms or molecules of the gas are excited to generate plasma, and the plasma is used to process a processing object film in the film structure on the sample. During the processing, intensity of light of a specific wavelength contained in plasma emission in the processing chamber varies with progress of etching of a specific film as a processing object or another film being processed.

In a previously known technique to accurately detect the endpoint of processing, a change in intensity of the light of the specific wavelength contained in emission from the processing chamber during etching processing is detected, and the endpoint of processing is detected based on results of such detection. However, such emission typically includes not only emission of the specific wavelength caused by a reaction greatly correlating with plasma properties or a film state during processing, but also emission associated with a change in intensity with the lapse of time. Thus, it is necessary to reduce or suppress erroneous detection due to such a variation in waveform of light of the wavelength as the detection object due to a so-called baseline.

Japanese Unexamined Patent Application Publication No. 2015-23104 (patent literature 1) discloses a technique to accurately detect a change in intensity of emission in response to such noise. In such an existing technique, an infinite impulse response (IIR) filter is used to detect a baseline component of a temporal change in a signal of emission intensity while following a temporal change in a gradient of the baseline component, and the detected baseline component is removed from the signal of emission intensity to extract a component of the change.

CITATION LIST

Patent Literature

Patent Literature 1: Japanese Unexamined Patent Application Publication No. 2015-23104.

SUMMARY OF INVENTION

Technical Problem

In the above-described existing technique, the following point is disadvantageously not sufficiently taken in account.

That is, the technique of patent literature 1 effectively removes the baseline component from the signal of emission intensity. However, light of a wavelength (basic wavelength) beforehand selected as a wavelength suitable for endpoint detection may be reduced in intensity, saturated, or increased in baseline due to a substance that adheres and accumulates on a window material, which transmits light from the processing chamber for detection, or on an inner wall surface. Hence, there has been a possibility of a reduction in detection accuracy if the endpoint is detected using only the basic wavelength. To solve such a problem and improve accuracy of endpoint detection, it is necessary to use light of a plurality of wavelengths, such as wavelengths other than the basic wavelength, for detection of the endpoint of processing, etching amount, and residual thickness. However, the above-described existing technique gives no consideration on such a technique to appropriately select the plurality of wavelengths to be used for determination of the endpoint.

A wavelength of light used for determination of the endpoint has been selected based on a determination coefficient, or selected using principal component analysis, or selected using nonnegative matrix factorization. In such selection, however, the extracted wavelength is only a wavelength that greatly varies due to the baseline or the like and thus not appropriate for detection of the endpoint or the residual thickness, which also leads to a possibility of a reduction in detection accuracy.

An object of the invention is to provide a plasma processing method that can appropriately select a plurality of wavelengths to be used and accurately detect residual thickness or etching amount, and a wavelength selection method used for the plasma processing.

Solution to Problem

The object is achieved by a plasma processing method, in which a processing object wafer is disposed within a processing chamber in the inside of a vacuum container, and plasma is generated by supplying a processing gas into the processing chamber and used to process a processing-object film layer beforehand formed on a surface of the wafer, and at least two wavelengths are selected from wavelengths with large mutual information in emission of a plurality of wavelengths of plasma generated during processing of the processing-object film layer, the mutual information indicating a correlation between a change of intensities of one emission of the two wavelengths on a change of intensities of the other emission at a time instance during processing of the processing-object film layer, and a temporal change in the emission of at least the two wavelengths is detected, and an endpoint of the processing of the film layer is determined based on a result of the detection, and the mutual information is obtained as a total sum, around time instances during the processing the processing-object, of a product of a joint distribution of the time series data indicating time variations of intensities of the one emission of the two wavelengths and time variations of intensities of the other emission and a natural logarithm of said joint distribution of the time series data by a product of each marginal distribution of said joint distribution of the time series data.

Advantageous Effects of Invention

According to the invention, even if a fundamental wavelength is hidden by saturation or in a baseline in a plasma processing apparatus, specifically in an etching processing apparatus, a wavelength selectable in place of the fundamental wavelength is only a wavelength having high dependency of change in emission intensity on the etching amount or the endpoint regardless of whether linear or not. An actual etching amount of a layer to be processed or the endpoint can be accurately detected based on the wavelength selected as described above.

BRIEF DESCRIPTION OF DRAWINGS

FIG. 3 is a schematic block diagram of an endpoint determinator illustrated in FIG. 1.

FIG. 4 is a flowchart illustrating a procedure of endpoint determination operation of the plasma processing apparatus of the embodiment illustrated in FIG. 1.

DESCRIPTION OF EMBODIMENTS

One embodiment of the invention will now be described with reference to the drawings.

The embodiment is described on a plasma processing apparatus and a method for operating the plasma processing apparatus. In the plasma processing apparatus, a film structure having a plurality of layers including a mask layer and a processing-object film layer is beforehand disposed on the upper surface of a substrate-like sample such as a semiconductor wafer disposed within a processing chamber in the inside of a vacuum container, and when the film structure is etched using plasma generated in the processing chamber, emission from the inside of the processing chamber, which contains light reflected by the film structure on the sample surface, is used to detect etching amount or determine the endpoint of etching. Specifically, the embodiment discloses a plasma processing method. In the method, only a plurality of wavelengths, which have high dependency of change in emission intensity on the etching amount or the endpoint regardless of whether linear or not, are selected as wavelengths in place of the fundamental wavelength. Thus, the amount of etching of the processing-object film layer in the film structure or the endpoint of the etching is accurately detected, and a shape of a pattern, which is formed by etching of the film structure so as to configure a circuit of a semiconductor device, can be made similar to a desired shape.

First Embodiment

One embodiment of the invention is described with FIGS. 1 to 4.

Figure 1:
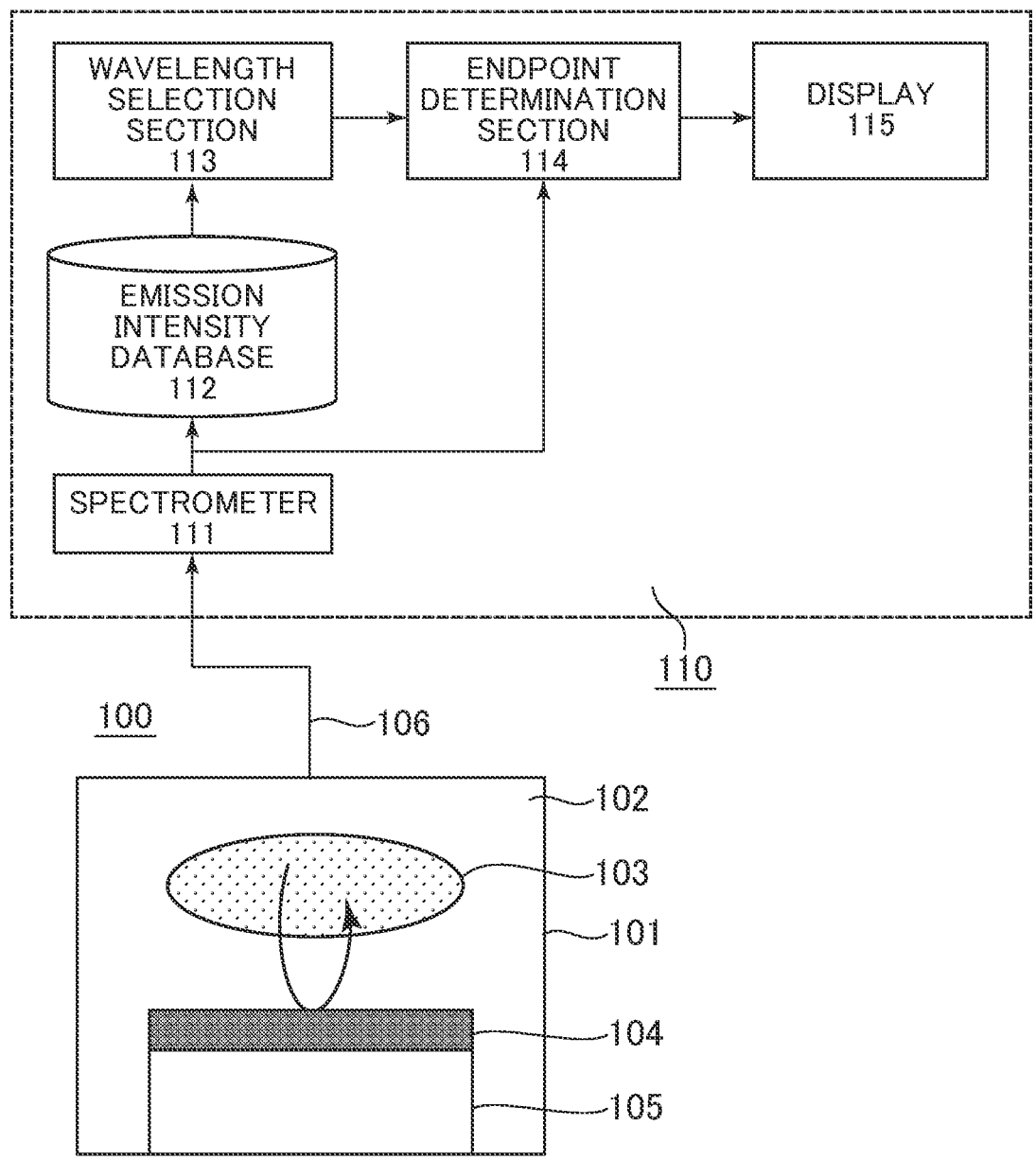
FIG. 1 is a schematic illustration of a configuration of a plasma processing apparatus according to an embodiment of the invention.

A configuration of a plasma processing apparatus according to a first embodiment is now described with reference to FIG. 1. FIG. 1 is a schematic illustration of a configuration of a plasma processing apparatus according to the first embodiment of the invention. Specifically, a plasma processing apparatus 100 of the first embodiment is used in a step of manufacturing a semiconductor device through etching processing of a substrate-like sample such as a semiconductor wafer transported into a processing chamber disposed within the plasma processing apparatus. The apparatus 100 is configured to include a detector that detects the amount of etching after processing of a sample, for example, residual thickness of a mask or a processing-object film layer or depth of a trench or a hole formed by etching, and control processing of the sample such as the semiconductor wafer based on output from the detector.

The plasma processing apparatus 100 of the first embodiment includes a vacuum container 101 having a cylindrical outer shape, in which a cylindrical processing chamber 102 is disposed, a plasma generator disposed outside the vacuum container 101 and acting as means for forming an electric or magnetic field to be supplied to generate plasma 103 in a space within the processing chamber 102, and an exhaust system connected to a lower part of the vacuum container 101 and including a vacuum pump such as a turbo-molecular pump to exhaust atoms or molecules of a gas, ions forming the plasma 103, highly active particles, and the like from a space in the processing chamber 102, and a regulator to regulate flowrate or velocity of the exhaust.

A sample stage 105 having a circular upper surface is disposed below the space, in which the plasma 103 is generated, in the processing chamber 102 so that the processing-object substrate-like sample 104 such as a semiconductor wafer is placed on the upper surface. In the first embodiment, an undepicted gas inlet is disposed in the inside of the processing chamber 102 to introduce a processing gas to generate the plasma 103 for processing of the sample 104, and the vacuum container 101 is connected to an undepicted gas line that configures a gas supply channel connecting between the gas inlet and a processing gas source and having a flowrate adjuster disposed in the middle of the gas supply channel so as to adjust a flowrate or velocity of the gas.

Furthermore, the plasma processing apparatus 100 of the first embodiment includes an etching amount detector 110 that is disposed outside the vacuum container 101 and receives emission of the plasma 103 generated during processing of the sample 104 performed using the plasma 103 within the processing chamber 102 or receives light from the inside of the processing chamber 102, such as interfering light from the surface of the sample 104, and detects intensity or a change in intensity of the light to detect residual thickness or etching amount (for example, depth of a trench or a hole) of a film layer as an object of the etching processing. To transmit light from the processing chamber 102 to the etching amount detector 110 during processing, a window member made of a translucent material such as quartz is disposed in a through-hole disposed in a sidewall of the vacuum container 101 surrounding the processing chamber 102 or in a member configuring a rid portion of the vacuum container 101 in the upper part of the processing chamber 102 while the inside and the outside of the window member are hermetically sealed by a sealant such as an O ring.

In such a plasma processing apparatus 100, the sidewall of the vacuum container 101 is coupled to an undepicted vacuum transport container being another vacuum container having a vacuum transport room as a pressure-reduced space, in which the processing object sample 104 is transported while being held on an arm of a robot disposed within the space. The unprocessed sample 104 is transported while being held on the arm of the robot in the vacuum transport room, and the sample 104 on the arm is transported by extension of the arm into the processing chamber 102 through the inside of a path communicating between the vacuum transport room and the processing chamber 102.

The sample 104 transported into the processing chamber 102 is then delivered onto the sample stage 105 and placed on a circular upper surface of a dielectric film covering the upper part of the sample stage 105. An opening closer to the vacuum transport room of the path, through which the sample 104 has passed, may be closed by an undepicted gate valve so that the inside of the processing chamber 102 is hermetically sealed. When the opening is thus closed, the sample 104 is held on the dielectric film by electrostatic force generated by DC power supplied to an electrode in the dielectric film. Subsequently, the processing gas is supplied from the gas source into the processing chamber 102 through the gas inlet while being appropriately adjusted in flowrate or velocity by the flowrate adjuster. In addition, the vacuum pump as a component of the exhaust system operates to exhaust the gas from the processing chamber 102 to the outside through an exhaust opening disposed below the sample stage 105 and facing the processing chamber 102.

The flowrate or velocity of the processing gas supplied to the processing chamber 102 is balanced with the flowrate or velocity of exhaust gas from the exhaust opening due to operation of the vacuum pump, thereby the internal pressure of the processing chamber 102 is adjusted to a value within a range suitable for processing of the sample 104. The electric or magnetic field generated by the plasma generator is supplied into the processing chamber 102, and atoms or molecules of the processing gas are excited and the plasma 103 is generated in a space above the sample 104 placed and held on the sample stage 105 or on the upper surface of the sample stage 105 in the processing chamber 102.

An undepicted disc-like or cylindrical metal electrode is disposed within the sample stage 105 and electrically connected to an undepicted high-frequency power supply outside the vacuum container 101. While the plasma 103 is generated, high-frequency power having a frequency different from a frequency of the electric field of the plasma generator is supplied from the high-frequency power supply to the electrode disposed within the sample stage 105, and a bias potential corresponding to a potential of the plasma 103 is formed within the processing chamber 102 above the upper surface of the sample 104.

Charged particles such as ions in the plasma 103 are attracted to above the upper surface of the sample 104 depending on a potential difference between the bias potential and the plasma potential, and collide with the surface of the film structure having a plurality of film layers including a mask layer made of an organic material and a processing-object film layer beforehand disposed on the upper surface of the sample 104. This progresses etching processing of the film layer on the surface of the sample 104, and in turn promotes a physical or chemical reaction between atoms or molecules of a highly reactive activated species such as radicals in the plasma 103. Thus, during processing of the processing-object film layer, in which anisotropic processing is accelerated in an attracting direction of the charged particles in the processing-object film layer, light is emitted due to a reaction product produced by an interaction between the activated species in the plasma 103 or the plasma 103 containing the physical or chemical reaction and the surface of the sample 104.

In the configuration of the first embodiment, emission occurring in the processing chamber 102 during such processing is detected during the processing by the etching amount detector 110, and the processing amount (for example, residual thickness of the processing object film or the mask layer such as a photoresist disposed over that film, or etching depth of the trench or the hole formed in the processing object film) is accurately detected. In addition, the endpoint of the processing is adjustably determined, or processing conditions, such as the flowrate of the supplied processing gas, internal pressure of the processing chamber 102, and values and distribution of intensity of the electric or magnetic field for generating the plasma, are adjustably set. The etching amount detector 110 includes a photoreceptor disposed outside the window member and receiving light through the window member from the inside of the processing chamber 102, and a spectrometer 111 that resolves light transmitted from the photoreceptor through a transmitter such as an optical fiber 106 into spectra of predetermined frequencies or wavelengths. Specifically, in the first embodiment, an undepicted measuring light source (for example, halogen light source) is provided within the spectrometer 111 and emits multiwavelength light. The multiwavelength light passes through the window member through the optical fiber 106 and is introduced into the film structure on the surface of the sample 104 disposed on the upper surface of the sample stage 105 within the processing chamber 102.

In the first embodiment, the window member is disposed facing the plasma 103 in a through-hole formed in a member, which is disposed facing the upper surface of the sample 104 on the upper side of the processing chamber 102 and configures a sealing surface of the processing chamber 102. The light emitted from the measuring light source enters the processing chamber 102 through the window member and is incident on the upper surface of the sample 104 at a right angle or an angle similar to the right angle. When reaching the upper surface of the sample 104, the emitted light is reflected toward the processing chamber 102 at boundaries between the film layers of the film structure beforehand disposed on the upper surface of the sample 104, and passes through the window member again and is transmitted through the optical fiber 106 to the photoreceptor of the etching amount detector 110 and to the spectrometer 111 optically or electrically coupled to the photoreceptor.

The emitted light is thus perpendicularly incident on the surface of the sample 104 and reflected at boundaries between the film layers disposed at different positions in a depth direction of the film structure. Such reflected light rays interfere with one another and form interfering light having intensities corresponding to distances between such depth positions. Such interfering light caused by the emitted light containing a plurality of wavelengths is introduced into the spectrometer 111, in which the light is resolved into the respective wavelengths and intensity of light of each wavelength is detected.

The etching amount detector 110 of the first embodiment has a function of selecting a plurality of wavelengths in place of the fundamental wavelength from the signal of intensity of the interfering light detected during processing of the sample 104, as described below. Thus, the etching amount detector 110 can accurately detect etching depth or residual thickness of the processing-object film layer, for example, a polysilicon film on the sample 104, or residual thickness of the mask layer. In addition, the etching amount detector 110 can accurately determine the endpoint of etching processing.

The signal showing the intensity of the interfering light of the predetermined wavelengths detected by the spectrometer 111 corresponds to a component contained in a temporal waveform of the light of the plurality of wavelengths from the inside of the processing chamber 102, and is referred to as emission intensity signal. The emission intensity signal is transmitted to an emission intensity database 112 electrically connected to the spectrometer 111 and stored in the database 112. The emission intensity signal is also transmitted to an endpoint determination section 114.

The emission intensity signals, which are obtained in processing of a plurality of wafers and stored in the emission intensity database 112, are transmitted to a wavelength selection section 113. The wavelength selection section 113 calculates mutual information between a change in intensity of each wavelength and a change in intensity of the fundamental wavelength from the emission intensity signals for the plurality of wafers. Further, a wavelength used for determination of the etching amount or the endpoint is selected depending on the amount of mutual information. The wavelength selected by the wavelength selection section 113 and the mutual information for each wavelength are transmitted to the endpoint determination section 114.

The endpoint determination section uses the wavelength selected by the wavelength selection section 113 to detect the etching amount from the emission intensity signal received from the spectrometer 111 for determination of the endpoint. Further, the etching amount may be detected for determination of the endpoint based on the emission intensity signal multiplied by the mutual information for each wavelength calculated by the wavelength selection section 113. A previously known technique such as, for example, a technique of Japanese Unexamined Patent Application Publication No. 2007-234666 can be used as a technique for determining the etching amount or the endpoint.

In the first embodiment, the etching amount of the sample 104 detected by the endpoint determination section 114 is transmitted to a display 115 including a monitor of CRT or liquid crystal and displayed.

Figure 2:
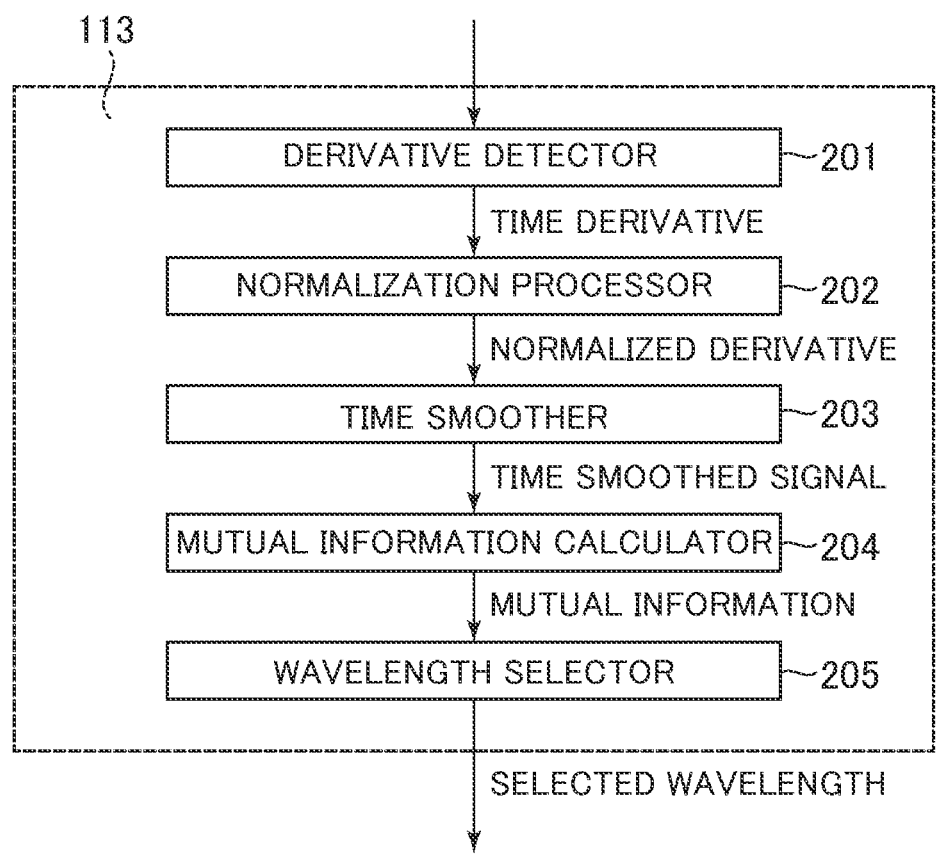
FIG. 2 is a schematic block diagram of a configuration of a wavelength selector illustrated in FIG. 1.

A configuration of the wavelength selection section 113 of the first embodiment is now described with reference to FIG. 2. FIG. 2 is a schematic block diagram of a configuration of the wavelength selection section 113 as a component of the etching amount detector 110 illustrated in FIG. 1.

In FIG. 2, the emission intensity signals obtained in processing of a plurality of wafers, which are output from the emission intensity database 112 and transmitted to the wavelength selection section 113, are first transmitted to a time derivative calculator 201 that then calculates a time derivative of a temporal waveform for each wavelength for the wafers. Using the time derivative provides a temporal waveform that is less affected by a long-term trend component in the temporal waveform of each wavelength.

The signal indicating the time derivative value of intensity of the interfering light for each wavelength for the wafers is thus detected by the time derivative calculator 201 and is transmitted to a normalization processor 202. The processor 202 calculates a mean value and a standard deviation of such time derivative signals across wafers and over time, and a value (normalized time derivative signal) obtained by subtracting the mean value across all wafers and over time from the time derivative signal for the wafers and dividing the derivative as a result of the subtraction by the standard deviation across all wafers and over time. This expectedly leads to a further reduction in influence of the long-term trend component, and reduces influence of a variation in intensity depending on wavelengths.

Subsequently, the normalized time derivative signal for the wafers calculated by the normalization processor 202 is transmitted to a time smoother 203. The time smoother 203 calculates a signal (time smoothed signal) by smoothing the received normalized time derivative signal for the wafers in a time direction. This reduces influence of high-frequency noise.

Subsequently, the time smoothed signal for the wafers calculated by the time smoother 203 is transmitted to a mutual information calculator 204. The mutual information calculator 204 calculates mutual information between a change in intensity of each wavelength and a change in intensity of the fundamental wavelength based on the received time smoothed signal for the wafers. The first embodiment is based on the premise that at least one fundamental wavelength suitable for endpoint detection is beforehand found based on film composition information.

Subsequently, the mutual information for each wavelength calculated by the mutual information calculator 204 is transmitted to a wavelength selector 205. The wavelength selector 205 receives the mutual information for each wavelength and selects wavelengths with relatively large mutual information. For example, the wavelength selector 205 may select prescribed number of wavelengths in the order of larger mutual information, or may select wavelengths with mutual information equal to or larger than a prescribed threshold.

The processing performed by each block of FIG. 2 is now described in detail.

In the first embodiment, for convenience, a time waveform signal indicating a change in intensity of light of each wavelength, which is sent from the processing chamber 102 and output from the spectrometer 111 at arbitrary time t in a predetermined period during processing of the sample 104, is represented as y_m, n, t for each wafer and for each wavelength. The index m indicates a wafer, and may be affixed such that its value increases or decreases in the processing order, or may be reassigned after picking only appropriately selected wafers. The index n indicates a wavelength, and in the first embodiment, may be affixed such that its value regularly increases or decreases from a short wavelength to a long wavelength, or may be reassigned after picking appropriately selected wavelengths.

The index t indicates time.

The time derivative calculator 201 calculates a derivative value $\Delta y\_m, n, t$ from $y\_m, n, t$ for each wafer and for each wavelength. In an exemplary procedure, such calculation is performed as follows: $\Delta y\_m, n, t = y\_m, n, t - y\_\{m, n, t-1\}$. It is assumed that $\Delta y\_m, n, t=0$ is given at the first sample point.

A gradient of a linear regression may be used in place of the derivative. A second-order derivative or a gradient of a quadratic regression may also be used. When a signal at every time is obtained at every unit time, time derivative calculation is also performed for each sample in a possible configuration.

When samples at all times are acquired together (offline processing), time derivative values at all times are obtained in batch processing in a possible configuration. As described above, when data are obtained for each sample, processing is performed for each sample, and when samples are acquired together, the samples are also processed together. Such a configuration is used as well in any processing in this invention.

In the normalization processor 202, a mean value µ_n on the time derivative value Δy_m, n, t for each wafer and for each wavelength is obtained across all wafers and over time in an ensemble average form. Further, the standard deviation σ_n across all wafers and over time is calculated as a square root of the ensemble average of (Δy_m, n, t−µ_n)2. Further, the normalized time derivative signal is calculated as z_m, n, t=(Δy_m, n, t−µ_n)/σ_n.

The time smoother 203 calculates a signal (time smoothed signal) s_m, n, t by smoothing the normalized time derivative signal z_m, n, t for each wafer and for each wavelength in a time direction. In an exemplary time smoothing procedure, the time smoothed signal can be calculated by three-point averaging, such as, for example, s_m, n, t=(z_{m, n, t−1}+z_m, n, t+z_{m, n, t+1})/3. It is assumed that s_m, n, t=(z_m, n, t+z_{m, n, t+1})/2 is given at a first sample point. It is assumed that s_m, n, t=(z_{m, n, t−1}+z_m, n, t)/2 is given at a last sample point.

The time smoothing may be performed by averaging of any number of samples, such as three-point averaging, five-point averaging, and seven-point averaging. Alternatively, median filtering, convolution operation of a low-pass filter, or spline smoothing may be used in place of the averaging.

The mutual information calculator 204 calculates mutual information I_n between a change in intensity at each wavelength n and a change in intensity at the fundamental wavelength n_0 from a time smoothed signal s_m, n, t for each wafer and for each wavelength. In a procedure of the mutual information calculation, first, s_{m, n_0, t} across all wafers m and over full time t are arranged in ascending order with respect to the fundamental wavelength n_0. Such an ascending order list is denoted as L(n_0).

Subsequently, s_m, n, t across all wafers m and over full time t are arranged in ascending order with respect to a wavelength n. Such an ascending order list is denoted as L(n). A specified minimum discretization sample number G_min is assigned to a discretization sample number G. The elements of L(n_0) arranged in the ascending order are equally divided into G groups.

The equally divided list is denoted as LG(n_0). The elements of L(n) arranged in ascending order are equally divided into G groups. The equally divided list is denoted as LG(n). An index g is affixed to the group of LG(n_0), and an index h is affixed to the group of LG(n).

The number of elements of the group g of LG(n_0) is indicated by c(g), and the number of elements of the group h of LG(n) is indicated by c(h). The number of elements of a set of m and t is indicated by c(g, h), where s_{m, n_0, t} belongs to the group g of LG(n_0) and s_m, n, t belongs to the group h of LG(n). The mutual information is calculated as follows.

$$I\_G, n = \Sigma\_g \Sigma\_h \, c(g,h)/(MT) \times \{\log(c(g,h)/(MT)) - \log(c(g)/(MT)) - \log(c(h)/(MT))\}$$

where M is the number of all wafers, and T is the number of all time indexes.

Subsequently, 1 is added to G, and I_{G+1, n} is calculated by similar processing. In this way, while G is increased from the specified minimum discretization sample number G_min to the maximum discretization sample number G_max, I_{G_min, n} to I_{G_max, n} are sequentially calculated. The largest I_G, n among I_{G_min, n}, I_{G_min+1, n} to I_{G_max, n} is output as the final mutual information I_n.

The wavelength selector 205 selects a specified number of pieces of mutual information I_n for respective wavelengths in descending order of n. Alternatively, the wavelength selector 205 may select a plurality of pieces of n where I_n is equal to or larger than a specified threshold.

Subsequently, a configuration of the endpoint determination section 114 of the first embodiment is described with reference to FIG. 3. FIG. 3 is a schematic block diagram of the endpoint determination section 114 as a component of the etching amount detector 110 illustrated in FIG. 1.

In FIG. 3, the emission intensity signal for each wavelength, which is output from the spectrometer 111 and transmitted to the endpoint determination section 114, is first transmitted to a time derivative calculator 301 that then calculates a time derivative of a temporal waveform for each wavelength. Using the time derivative provides a temporal waveform that is less affected by a long-term trend component in the temporal waveform of each wavelength.

The signal indicating the time derivative value of intensity of the interfering light for each wavelength is thus detected by the time derivative calculator 301 and is transmitted to a normalization processor 302. The processor 302 calculates a value (normalized time derivative signal) obtained by subtracting the mean value across all wafers and over time from the time derivative signal and dividing the derivative as a result of the subtraction by the standard deviation across all wafers and over time. This expectedly leads to a further reduction in influence of the long-term trend component, and reduces influence of a variation in intensity depending on wavelengths. Values are beforehand calculated by the normalization processor 202 of the wavelength selection section 113 and used as the mean value and the standard deviation of the time derivative signals across wafers and over time.

Subsequently, the normalized time derivative signal calculated by the normalization processor 302 is transmitted to a time smoother 303. The time smoother 303 calculates a signal (time smoothed signal) by smoothing the received normalized time derivative signal in a time direction. This reduces influence of high-frequency noise.

Subsequently, the time smoothed signal calculated by the time smoother 303 is transmitted to a mutual information multiplier 304. The mutual information multiplier 304 calculates a signal (mutual information-multiplied signal) as a result of multiplication of the received time smoothed signal by mutual information for each wavelength. This results in weighting by the mutual information, and reduces influence of a wavelength having a small dependence on the etching amount, the endpoint, or a change in intensity of emission. In addition, the mutual information multiplier 304 reserves only the signal of the selected wavelength sent from the wavelength selection section 113 among the mutual information-multiplied signals for respective wavelengths and eliminates signals of other wavelengths. This provides further high selectivity.

Subsequently, the mutual information-multiplied signal calculated by the mutual information multiplier 304 is transmitted to an etching amount estimator 305. The etching amount estimator 305 calculates a similarity of a vector including a sequence of values of all wavelengths at each time of the mutual information-multiplied signal beforehand stored in association with the etching amount to a vector including a sequence of values of all wavelengths at each time t of the mutual information-multiplied signal, and outputs an etching amount in association with a vector with the highest similarity. For example, cosine similarity or the reciprocal of a Euclidean distance may be used as the similarity between the vectors.

Alternatively, the etching amount estimator 305 calculates a similarity of a vector including a sequence of values of all wavelengths at time t-D of the mutual information-multiplied signal to a vector including a sequence of values of all wavelengths at each time t of the mutual information-multiplied signal. Here, D is a specified positive constant. Further, the etching amount estimator 305 calculates an absolute value of a time derivative value on the calculated similarity for each time. Further, the etching amount estimator 305 outputs a cumulative value in a time direction of the time derivative absolute value as the etching amount.

Subsequently, the etching amount calculated by the etching amount estimator 305 is transmitted to an endpoint determinator 306. The endpoint determinator 306 determines whether the current time is the endpoint depending on the etching amount for each time. Whether the current time is the endpoint may be determined, for example, based on whether the etching amount at a relevant time is equal to or larger than a specified threshold, whether the absolute value of the time derivative value of the etching amount at a relevant time is equal to or larger than a threshold, or whether the second-order time derivative of the etching amount at a relevant time has zero cross.

A flowchart of the etching processing of the first embodiment is shown in FIG. 4. FIG. 4 is a flowchart illustrating a procedure of operation of the plasma processing apparatus of the first embodiment illustrated in FIG. 1 to determine the etching amount.

In the first embodiment, a parameter is first set before the plasma processing apparatus 100 processes the sample 104, or before start of processing, in which the film structure including the mask layer and the processing-object film layer beforehand disposed on the surface of the sample 104 is etched, or before processing data obtained during the etching processing (step 401). In the configuration of the first embodiment, the parameter is set before start of operation.

Subsequently, plasma is generated in the processing chamber 102, a bias potential is generated above the surface of the sample 104 by high-frequency power from a high-frequency power source, and etching processing of the processing-object film layer on the sample 104 is started, and then detection of light from the inside of the processing chamber 102 is started (step 402). In the first embodiment, as illustrated in FIG. 3, a change in intensity of light of each wavelength of predetermined spectra of a plurality of wavelengths, which is obtained by dispersing light received from the inside of the processing chamber 102, is detected at every time t in a sampling interval $\Delta t$. Intensity of light of each of the plurality of wavelengths is thus detected at every interval $\Delta t$, and a time derivative $\Delta y\_n, t$ of the intensity is calculated from a signal of the intensity by time derivative calculation (step 403).

Subsequently, a normalized time derivative signal $z\_n, t$ is calculated on the obtained time derivative signal $\Delta y\_n, t$ (step 404). Further, a time smoothed signal $s\_n, t$ is calculated based on the normalized time derivative signal $z\_n, t$ (step 405). The obtained time smoothed signal $s\_n, t$ is multiplied by mutual information $I\_n$ to calculate a mutual information-multiplied signal (step 406). The etching amount is estimated based on the mutual information-multiplied signal (step 407). Endpoint determination is performed in correspondence to the etching amount estimated in such a manner (step 408). When the etching amount is determined to reach a desired etching amount, detection of light from the inside of the processing chamber 102 is finished and plasma is extinguished, leading to the end of etching processing of the processing-object film layer using the plasma on the surface of the sample 104 (step 409). When it is determined that the etching amount does not reach the desired etching amount, a subsequent relevant film layer is etched without interruption, and light from the inside of the processing chamber 102 is detected by the etching amount detector 110 at subsequent time $t+\Delta t$.

The etching endpoint or the etching amount can be determined using a previously known technical means or method, such as detection of a change in intensity of emission from plasma of a wavelength associated with a reaction product from an under-film layer disposed adjacent to the lower boundary of the processing-object film layer. Further, in a usable existing technique, a change in intensity of interfering light, which comes from a plurality of boundary surfaces of a film structure including a plurality of film layers beforehand disposed on the surface of the sample 104, is detected, and a result of the detection is compared with a pattern of a beforehand obtained residual thickness value and intensity of interfering light with a wavelength as a parameter or a differential value of the intensity, to detect the etching amount from the residual thickness or initial thickness.

For example, the first embodiment is effective in the case where the processing-object film layer includes two film layers configured of respective different materials and vertically stacked with a boundary between the two film layers, and emission from the materials configuring the two film layers or compounds of the respective materials and the processing gas contains a plurality of wavelengths with large mutual information.

The first embodiment is also effective in the case where the processing-object film layer includes a lower first film layer, an upper second film layer, and a third film layer formed between the first film layer and the second film layer when the second film layer is formed over the first film layer, and the two film layers include the first and second film layers or the second and third film layers. This is because, in such a case, a change in intensity of a wavelength to be used for estimating the etching amount is not always in linear correlation with a change in intensity of the fundamental wavelength, but may be nonlinearly in relation to the change in intensity of the fundamental wavelength while having a dependency on the intensity of the fundamental wavelength. In the case of the nonlinear relation, a level of the dependency cannot be estimated by an index such as a correlation coefficient, but can be advantageously estimated by the mutual information.

The invention should not be limited to the above-described embodiment, and includes various modifications and alterations. For example, the above-described embodiment has been described in detail to clearly explain the invention, and the invention is not necessarily limited to the embodiment having all the described configurations.

In addition, part of a configuration of one embodiment can be substituted for a configuration of another embodiment, and a configuration of one embodiment can be added to a configuration of another embodiment. Furthermore, a configuration of one embodiment can be added to, eliminated from, or substituted for part of a configuration of another embodiment.

The above-described configurations, functions, processing sections, and/or processing means may be partially or entirely achieved by hardware, such as, for example, designing with an integrated circuit. The configurations, functions, and the like may be achieved by software with a processor that interprets and executes a program to implement each function. The information such as the program to implement each function, a table, and a file can be stored in a recording device such as a memory, a hard disc, and a solid state drive (SSD) or a recording medium such as an IC card, an SD card, and DVD.

The illustrated control lines and information lines are those considered to be necessary for explanation, and all control lines and information lines for a product are not necessarily disclosed. In an actual apparatus, many components configuring the apparatus, or unit sets constituted by combining such components are connected to one another.

LIST OF REFERENCE SIGNS

100 Plasma processing apparatus
101 Vacuum container
102 Processing chamber
103 Plasma
104 Sample
105 Sample stage
106 Optical fiber
110 Etching amount detector
111 Spectrometer
112 Emission intensity database
113 Wavelength selection section
114 Endpoint determination section
115 Display

The invention claimed is:

1. A plasma processing method, comprising:
disposing a processing object wafer within a processing chamber in the inside of a vacuum container; and
processing a processing-object film layer beforehand formed on a surface of the wafer using plasma generated by supplying a processing gas into the processing chamber,
wherein at least two wavelengths are selected from wavelengths with large mutual information in emission of a plurality of wavelengths of plasma generated during processing of the processing-object film layer, the mutual information indicating a correlation between a change of intensities of one emission of the two wavelengths on a change of intensities of the other emission at a time instance during processing of the processing-object film layer, and a temporal change in the emission of at least the two wavelengths is detected, and an endpoint of the processing of the film layer is determined based on a result of the detection, and
wherein the mutual information is obtained as a total sum, around time instances during the processing the processing-object, of a product of a joint distribution of the time series data indicating time variations of intensities of the one emission of the two wavelengths and time variations of intensities of the other emission and a natural logarithm of said joint distribution of the time series data by a product of each marginal distribution of said joint distribution of the time series data.

2. The plasma processing method according to claim 1, wherein the processing-object film layer includes two film layers including respective different materials and vertically stacked with a boundary between the two film layers, and at least the two wavelengths are selected from the plurality of wavelengths with large mutual information in emission from the materials configuring the two film layers or from compounds of such materials and the processing gas.

3. The plasma processing method according to claim 2, wherein the processing-object film layer includes a lower first film layer, an upper second film layer, and a third film layer formed between the first and second film layers when the second layer is formed over the first film layer, and the two film layers include the first film layer and the second film layer, or the second film layer and the third film layer.

4. The plasma processing method according to claim 1, wherein the endpoint of the processing of the film layer is determined using a temporal change in a value of multiplying a value of the mutual information of each of the two wavelengths by intensity of the emission or a value of multiplying the value of the mutual information of each of the two wavelengths by a value of a temporal change in intensity of the emission.

5. The plasma processing method according to claim 1, wherein after the endpoint is determined, the processing-object film layer is processed under a modified condition of processing the processing-object film layer.

6. The plasma processing method according to claim 1, wherein the time series data indicating the time variations of intensities are data of time smoothed signals obtained based on the normalized time derivatives of time series data of light intensities of the two wavelengths during processing of the processing-object film layer.

7. The plasma processing method according to claim 6, wherein the processing-object film layer includes two film layers including respective different materials and vertically stacked with a boundary between the two film layers, and at least the two wavelengths are selected from the plurality of wavelengths with large mutual information in emission from the materials configuring the two film layers or from compounds of such materials and the processing gas.

8. The wavelength selection method according to claim 7, wherein the processing-object film layer includes two film layers including respective different materials and vertically stacked with a boundary between the two film layers, and at least the two wavelengths are selected from among the plurality of wavelengths with large mutual information in emission from the materials configuring the two film layers or from compounds of such materials and the processing gas.

9. The wavelength selection method according to claim 7, wherein the endpoint of the processing of the film layer is determined using a temporal change in a value of multiplying a value of the mutual information of each of the two wavelengths by intensity of the emission or a value of multiplying the value of the mutual information of each of the two wavelengths by a value of a temporal change in intensity of the emission.

10. The plasma processing method according to claim 6, wherein the endpoint of the processing of the film layer is determined using a temporal change in a value of multiplying a value of the mutual information of each of the two wavelengths by intensity of the emission or a value of multiplying the value of the mutual information of each of the two wavelengths by a value of a temporal change in intensity of the emission.

11. The plasma processing method according to claim 6, wherein after the endpoint is determined, the processing-object film layer is processed under a modified condition of processing the processing-object film layer.

12. A wavelength selection method comprising:

selecting a predetermined wavelength of emission from plasma during plasma processing, the predetermined wavelength being used to determine an endpoint of the plasma processing, the plasma processing comprising disposing a processing object wafer within a processing chamber in the inside of a vacuum container; and processing a processing-object film layer beforehand formed on a surface of the wafer using plasma generated by supplying a processing gas into the processing chamber, wherein at least two wavelengths are selected during a period before and after reaching the endpoint from among wavelengths with large mutual information in emission of a plurality of wavelengths of the plasma generated during processing of the processing-object film layer, the mutual information indicating a correlation between a change of one emission of the two wavelengths on a change of intensities of the other emission at a time instance during processing of the processing-object film layer, and wherein the mutual information is obtained as a total sum, around time instances during the processing the processing-object, of a product of a joint distribution of the time series data indicating time variations of intensities of the one emission of the two wavelengths and time variations of intensities of the other emission and a natural logarithm of said joint distribution of the time series data by a product of each marginal distribution of said joint distribution of the time series data.

13. The wavelength selection method according to claim 12, wherein the processing-object film layer includes two film layers including respective different materials and vertically stacked with a boundary between the two film layers, and at least the two wavelengths are selected from among the plurality of wavelengths with large mutual information in emission from the materials configuring the two film layers or from compounds of such materials and the processing gas.

14. The wavelength selection method according to claim 13, wherein the processing-object film layer includes a lower first film layer, an upper second film layer, and a third film layer formed between the first and second film layers when the second layer is formed over the first film layer, and the two film layers include the first film layer and the second film layer, or the second film layer and the third film layer.

15. The wavelength selection method according to claim 12, wherein the endpoint of the processing of the film layer is determined using a temporal change in a value of multiplying a value of the mutual information of each of the two wavelengths by intensity of the emission or a value of multiplying the value of the mutual information of each of the two wavelengths by a value of a temporal change in intensity of the emission.

16. The wavelength selection method according to claim 12, wherein the time series data indicating the time variations of intensities are data of time smoothed signals obtained based on the normalized time derivatives of time series data of light intensities of the two wavelengths during processing of the processing-object film layer.

* * * * *